US012505991B2

(12) United States Patent
Holland et al.

(10) Patent No.: US 12,505,991 B2
(45) Date of Patent: Dec. 23, 2025

(54) TUNABILITY OF EDGE PLASMA DENSITY FOR TILT CONTROL

(71) Applicant: Lam Research Corporation, Fremont, CA (US)

(72) Inventors: John Holland, San Jose, CA (US); Stephan K. Piotrowski, San Jose, CA (US); Jaewon Kim, Fremont, CA (US); Pratik Mankidy, Fremont, CA (US); Takumi Yanagawa, Fremont, CA (US); Dongjun Wu, San Jose, CA (US); Anthony De La Llera, Fremont, CA (US); Zehua Jin, Houston, TX (US)

(73) Assignee: Lam Research Corporation, Fremont, CA (US)

( * ) Notice: Subject to any disclaimer, the term of this patent is extended or adjusted under 35 U.S.C. 154(b) by 595 days.

(21) Appl. No.: 17/797,669

(22) PCT Filed: Feb. 2, 2021

(86) PCT No.: PCT/US2021/016267
§ 371 (c)(1),
(2) Date: Aug. 4, 2022

(87) PCT Pub. No.: WO2021/162895
PCT Pub. Date: Aug. 19, 2021

(65) Prior Publication Data

US 2023/0063007 A1 Mar. 2, 2023

Related U.S. Application Data

(60) Provisional application No. 62/972,479, filed on Feb. 10, 2020.

(51) Int. Cl.
*H01J 37/32* (2006.01)

(52) U.S. Cl.
CPC .. *H01J 37/32715* (2013.01); *H01J 37/32642* (2013.01); *H01J 37/32449* (2013.01); *H01J 37/32532* (2013.01)

(58) Field of Classification Search
CPC .......... H01J 37/32449; H01J 37/32467; H01J 37/32477; H01J 37/32532; H01J 37/32642; H01J 37/32651; H01J 37/32715
See application file for complete search history.

(56) References Cited

U.S. PATENT DOCUMENTS 6,376,385 B2 4/2002 Lilleland et al.
6,673,198 B1 * 1/2004 Wicker ............ H01J 37/32495 118/728

(Continued)

FOREIGN PATENT DOCUMENTS

JP H 8-148472 B 6/1996
JP H008148472 A 6/1996

OTHER PUBLICATIONS

ISR & Written Opinion PCT/US2021/016267, dated Jul. 8, 2021, 8 pages.

*Primary Examiner* — Tung X Le
(74) *Attorney, Agent, or Firm* — PENILLA IP, APC

(57) ABSTRACT

A plasma lining structure is used in a process chamber to block direct line-of-sight for plasma generated within to grounded surface. The plasma lining structure includes a plurality of sections to cover at least one or more portions of an inside surface of a plasma confinement structure disposed in the process chamber. The sections of the plasma lining structure are positioned between a plasma region and the sidewall of the plasma confinement structure, when the plasma lining structure and the plasma confinement structure (Continued)

are disposed in the plasma chamber, such that the sections directly face the plasma region.

17 Claims, 7 Drawing Sheets

(56) References Cited

U.S. PATENT DOCUMENTS

| | | | | |
|---|---|---|---|---|
| 7,131,391 | B2 | 11/2006 | Hineman et al. | |
| 8,677,590 | B2 | 3/2014 | Hudson et al. | |
| 9,963,782 | B2 * | 5/2018 | Tsuji ................. | H01J 37/32091 |
| 2007/0085483 | A1 | 4/2007 | Ni et al. | |
| 2009/0206058 | A1 * | 8/2009 | Iwata ................ | H01J 37/32027 156/345.35 |
| 2010/0154996 | A1 | 6/2010 | Hudson et al. | |
| 2011/0005685 | A1 * | 1/2011 | Nguyen ................ | H01J 37/321 156/345.43 |
| 2014/0053984 | A1 | 2/2014 | Doh et al. | |
| 2015/0044873 | A1 | 2/2015 | Kellogg | |
| 2015/0279633 | A1 | 10/2015 | Carducci et al. | |
| 2016/0155614 | A1 * | 6/2016 | Kim .................. | H01J 37/32532 156/345.52 |
| 2016/0260582 | A1 * | 9/2016 | Hosaka ............. | H01J 37/32633 |
| 2017/0256383 | A1 | 9/2017 | Liao et al. | |

* cited by examiner

TUNABILITY OF EDGE PLASMA DENSITY FOR TILT CONTROL

CLAIM OF PRIORITY

This application is a national stage filing of and claims priority, under 35 U.S.C. § 371, to PCT/US21/16267, filed on Feb. 2, 2021, and titled "TUNABILITY OF EDGE PLASMA DENSITY TILT CONTROL", which claims the benefit of and priority, under 35 U.S.C. § 119 (e), to Provisional Patent Application No. 62/972,479, filed on Feb. 10, 2020, and titled "TUNABILITY OF EDGE PLASMA DENSITY FOR TILT CONTROL", both of which are incorporated by reference herein in their entirety.

BACKGROUND

1. Field of the Invention

The present embodiments relates to systems and devices for controlling plasma density on a wafer during an etch application.

2. Description of the Related Art

Substrates (e.g., wafers, flat panels) are subjected to various types of processing to form electronic products, such as integrated circuits, flat panel displays, etc. Substrates are placed in a process chamber and subjected to different processing operations, such as plasma etch, cleaning, deposition, etc., that expose the surface of the substrate to different chemistries. For example, during plasma etch operation, selective portions of the surface of the substrate are exposed to the plasma. The portions are selectively exposed by placing a photoresist mask layer on the substrate surface and subjecting the substrate to plasma etch, so as to allow the plasma etch to remove underlying materials that are not covered by the photoresist.

The etching was conventionally done largely to develop planar (i.e., two dimensional) devices (e.g., memory devices), wherein single layer memory cells were defined. In order to lower the cost of manufacturing these devices, manufacturers tried to scale the planar devices by shrinking size of the memory cells. However, scaling the planar devices to achieve higher densities had its own challenges due to cell-to-cell interference, thereby reducing the reliability of such planar devices. In order to maximize the limited physical space on a wafer, minimize cost of manufacturing the devices, and to provide reliable devices, three-dimensional (3D) devices were developed. In 3D NAND devices, for example, memory cells are stacked in multiple layers, thereby allowing more devices to be defined on the wafer. An advantage of the 3D devices is that the vertical stacks allow the memory cells to be larger, boosting storage and reliability.

However, the dielectric etch applications used to generate the 3D devices come with its own challenges. For example, controlling local and global tilts concurrently is a major challenge. Due to increase in aspect ratio, the tilt specification is increasingly tight. Global control of tilt is used to center a process in a regime with the best tilt over the entire wafer. Local control of tilt is used to fine tune the tilt in different regions on the wafer surface, including the center, middle, edge and extreme edge regions. Current available approaches for local tilt control are insufficient for meeting the tilt specification over the different regions of the wafer surface. Specifically, it is very hard to independently control the tilt specification at the wafer edge region of the wafer. Various approaches to independently control the local tilt have been tried with some success. Further, these approaches provide additional challenges. For example, varying the RF frequency for generating the plasma, adjusting a design of an upper electrode, especially the portion of the upper electrode covering the wafer edge region, have been tried with minimal success and these approaches have posed varying levels of challenges. Other approaches, such as modifying plasma volume, modifying coupling to the ground ring, increasing upper electrode resistivity, have also been tried to control the local tilt at the wafer edge but each of these approaches have come with their own challenges.

It is in this context that embodiments of the invention arise.

SUMMARY

Systems, devices, and methods are presented for tuning edge plasma density in order to control tilt of the three-dimensional (3D) devices formed on a wafer by etch applications, such as high-aspect ratio (HAR) 3D etch applications. The tuning allows concurrent control of global and local tilts of the 3D devices. Global tilt control allows for centering a process in a regime with the best tilt over the entire wafer and the local tilt control allows for fine tuning the tilt in the various regions of the wafer, such as the center, middle, edge and extreme edge regions. The etch application is performed in a process chamber that includes a plasma confinement structure, such as a C-shroud, that confines the plasma within a plasma region defined in the process chamber. A plasma lining structure is provided to block a line-of-sight to at least a portion of an inner surface of a sidewall of the plasma confinement structure, for the wafer area plasma, thereby blocking the plasma's path to ground.

The plasma lining structure, while blocking the horizontal line-of-sight to the sidewall of the plasma confinement structure, preserves the ground return path for the plasma. The ground return path is defined along the upper electrode (inner upper electrode, outer upper electrode) and through the plasma confinement structure to the ground ring. By eliminating the horizontal line-of-sight to the large grounded surface (i.e., sidewall) of the plasma confinement structure, plasma density is significantly suppressed inside the plasma region, especially along the edge region of the wafer. Such suppression of the plasma density at the edge region results in a local improvement in etch rate uniformity at the edge region, thereby improving the tilt profile in the edge region of the wafer.

Various implementations can be envisioned. In one implementation, a plasma confinement structure with a plasma lining structure to cover at least a portion of an inner surface of the sidewall of the plasma confinement structure is provided. In this implementation, the plasma confinement structure may be a C-shroud. The plasma lining structure may be made of quartz or any other dielectric material. Variations in the amount of area of the plasma confinement structure covered by the plasma lining structure may also be envisioned. For example, only the inner surface of the sidewall of the plasma confinement structure may be covered by the plasma lining structure. In an alternate example, the entire inside surface of the plasma confinement structure exposed to the plasma may be covered by the plasma lining structure. In yet another example, only the inner surface of the sidewall and an underside surface of a top section of the plasma confinement structure may be covered by the plasma lining structure. In another example, only the inner surface of the sidewall and a top surface of a bottom section of the plasma confinement structure may be covered by the plasma lining structure.

In alternate implementations, a different design of the plasma confinement structure may be implemented. For example, the plasma confinement structure may be an E-shroud instead of a C-shroud, with a plurality of annular protrusions defined along the inner sidewall of the E-shroud. In this example, plasma lining structures (e.g., quartz members) may be disposed in the spaces between adjacent pair of the annular protrusions of the E-shroud and between the annular protrusions and the top and/or bottom sections of the E-shroud to sufficiently block access to the sidewall of the E-shroud. In alternate implementations, the plasma lining structure may be used to cover the inner surface of the E-shroud including surfaces of the annular protrusions and sidewalls of the E-shroud between the annular protrusions. A thickness of the plasma lining structure may be defined so as to sufficiently block the line-of-sight for the plasma to the grounded sidewall of the plasma confinement structure. The plasma lining structure may be made of two or more sections. In some implementations, each of the two or more sections are configured to form a ring substantially covering the entirety of the inner surface of the sidewall of the plasma confinement structure. In such implementations, each section may be reliably interlocked with an adjacent section. Alternately, the adjacent sections are configured to define a gap located therebetween. Each section may also be coupled to different portions of the plasma confinement structure, so as to allow for repeatable installation with well-defined orientation.

With the general understanding of the features, specific implementations will now be described.

In accordance with one implementation, a plasma lining structure for use with a plasma confinement structure having an annular, vertical sidewall, is disclosed. The sidewall has an inner surface. The plasma lining structure includes a plurality of sections that is configured to conform to and cover at least one or more portions of the inner surface of the sidewall. The plurality of sections are configured for positioning between a plasma region of a process chamber and the sidewall, when the plasma lining structure and the plasma confinement structure are disposed in the process chamber. The plurality of sections of the plasma lining structure are disposed to directly face the plasma region.

In accordance with another implementation, a plasma confinement structure for use in a process chamber to confine plasma generated within to a plasma region defined between an upper electrode and a lower electrode is disclosed. The plasma confinement structure includes an annular, vertical sidewall. The sidewall has an inner surface. A plasma lining structure includes a plurality of sections that are configured to conform to and cover at least one or more portions of the inner surface. The plurality of sections is configured for positioning between the plasma region and the sidewall, when the plasma confinement structure and the plasma lining structure are disposed in the plasma chamber. The plurality of sections is disposed to directly face the plasma region.

In yet another embodiment, a process chamber for use in confining plasma generated within to a plasma region is disclosed. The process chamber includes an upper electrode disposed in a top portion. The upper electrode is connected to a gas source and is configured to provide gas from a gas source to the process chamber, and is electrically grounded. The process chamber also includes a lower electrode disposed in a bottom portion of the process chamber. The lower electrode is oriented opposite to the upper electrode to define the plasma region located there-between. The lower electrode includes a support surface for receiving the wafer, and is connected to a plurality of radio frequency (RF) power sources through corresponding match networks. A plasma confinement structure is defined between the upper electrode and the lower electrode and is configured to confine the plasma to the plasma region. The plasma confinement structure includes an annular, vertical sidewall. The sidewall has an inner surface. A plasma lining structure including a plurality of sections is configured to conform to and cover at least one or more portions of the inner surface. The plurality of sections are configured for positioning between the plasma region and the sidewall, when the plasma confinement structure and the plasma lining structure are disposed in the process chamber, such that the plurality of sections directly faces the plasma region.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

Figure 1:
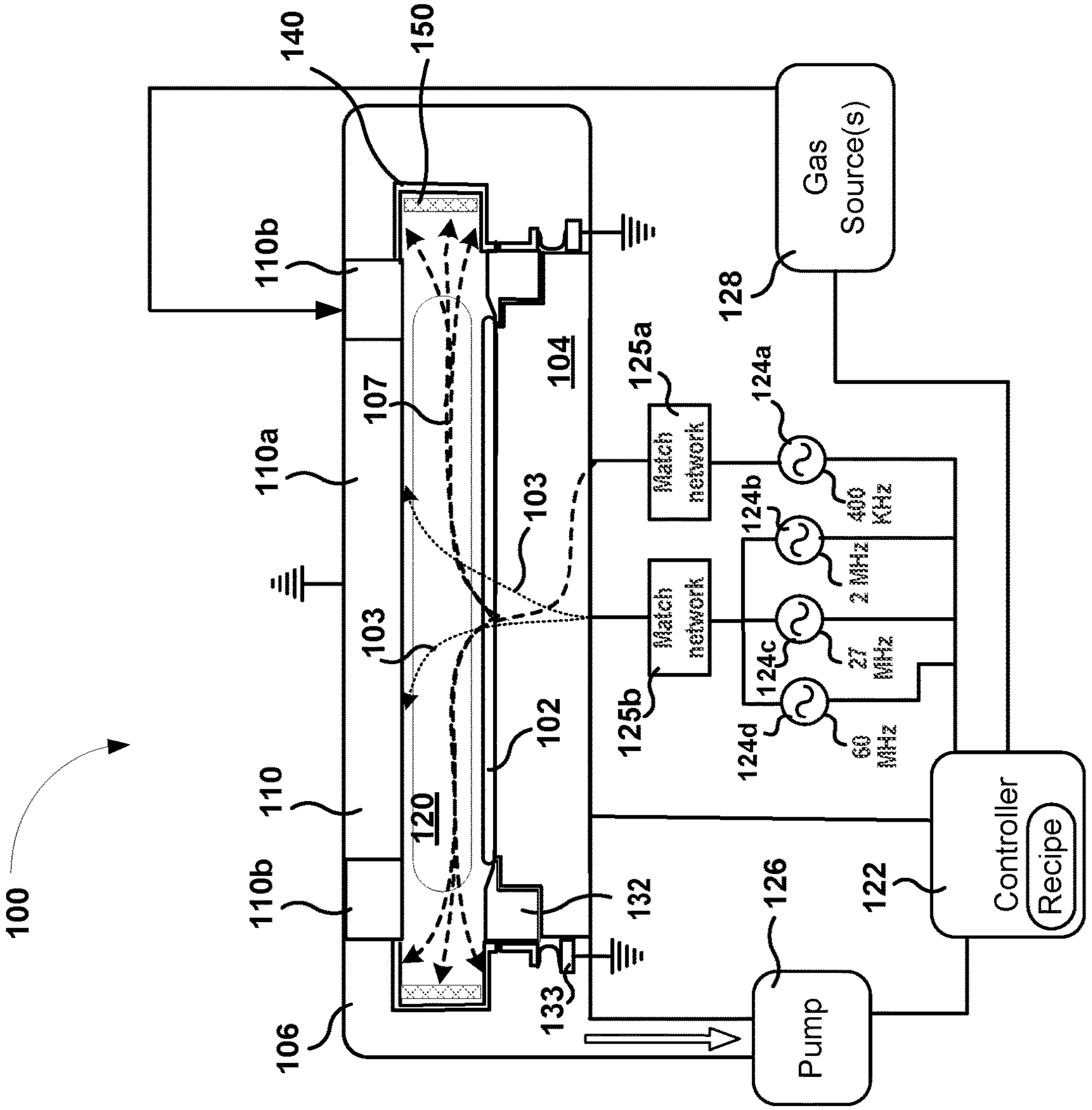
FIG. 1 illustrates a simplified block diagram of a process module that is used to tune plasma density along the edge of a wafer to control tilt of 3D devices formed thereon, in one implementation.

Embodiments present systems, devices and methods to tune plasma density along an edge of a wafer received in a process chamber. The tuning allows controlling tilt profile of three dimensional (3D) devices defined on a surface of the wafer. The process chamber may be a plasma etch chamber with the plasma being confined to a plasma region defined between an upper electrode and a lower electrode of the process chamber. A plasma confinement structure, such as a C-shroud, is disposed between the upper electrode and the lower electrode and is used to confine the plasma generated in the plasma chamber, to the plasma region. A plasma lining structure is provided to cover at least an inner surface of a sidewall of the plasma confinement structure disposed in the plasma chamber. The plasma lining structure assists in concurrently controlling global tilt and local tilt in order to improve tilt profile of 3D devices defined on the surface of the wafer. The global tilt control allows for centering a process in a regime that provides the best tilt over the entire wafer surface. Local tilt control allows for fine tuning the tilt in different regions of the wafer, including a center, middle, edge and extreme edge regions. The plasma lining structure enables local tilt control by blocking line-of-sight for the plasma generated in the plasma region to the grounded sidewall of the plasma confinement structure. The plasma lining structure, however, preserves the ground return path defined via the upper electrode through the plasma confinement structure to the ground ring. Due to the blocking of the line-of-sight for the plasma to the large grounded surface (i.e., expansive sidewall) of the plasma confinement structure, the density of the plasma inside the plasma confinement structure is significantly suppressed, especially at the edge of the wafer. The suppression of the plasma density results in a local improvement in etch rate uniformity in the edge region, which causes improvement in the tilt profile in the 3D devices defined thereon. The plasma lining structure is made of a plurality of sections that are disposed to conform to and cover at least one or more portions of the inner surface of the sidewall of the plasma confinement structure. Additional fine tuning can be performed by providing windows in the plasma lining structure or by controlling gaps between each pair of adjacent sections of the plasma lining structure. Size of the windows or the gap may be defined based on amount of fine tuning needed. The local tilt control is not limited to the wafer edge region but can also be done in other regions of the wafer, such as center, middle, and extreme edge regions.

In some methods of etching that uses a plasma confinement structure, such as a C-shroud, local tilt control may be more challenged. Also, with increasing aspect ratio and density, the tilt specification is increasingly tight. Global tilt control can be envisioned by centering a process to define best tilt over the entire wafer. However, the local tilt controls (provided in the form of dynamic "knobs") used for controlling certain attributes of the process chamber may not provide sufficient local tilt control. Example attributes that can be controlled include gaps in the processing region, flow ratio of the process gas(es), frequency used for generating the plasma, etc. Adjusting "static" chamber related attributes have shown minimal improvement in local tilt performance, especially in the edge and extreme edge regions of the wafer. Some of the static chamber related attributes include design/shape of inner electrode, outer electrode, edge kit used in the process chamber, coupling to the ground ring, upper electrode resistivity, etc. In addition to chamber related attributes, adjustment to process recipe related attributes, such as plasma volume in the plasma confinement structure (e.g., C-shroud), etc., have shown minimal improvement in local tilt performance, especially in the edge and extreme edge regions of the wafer. Independently tuning the different attributes, such as tuning frequency of the RF power, (e.g., tuning a 60 megahertz RF power source), has shown to provide an improvement in controlling the global tilt but have provided minimal local tilt control.

The plasma lining structure introduced between a sidewall of the plasma confinement structure and the plasma region assists in providing improvement to the local tilt control by blocking horizontal line-of-sight for the plasma to the ground. The plasma lining structure suppresses the plasma density in plasma region defined inside of the plasma confinement structure, and especially at the wafer edge. The plasma lining structure includes two or more sections with each pair of adjacent sections interfaced together at an interlocking interface. Additionally, the plasma lining structure may interface or be coupled with different portions of the plasma confinement structure using alignment pins or securing pins or mating surfaces. The interlocking of the different sections of the plasma lining structure enables a well-defined and repeatable orientation when assembled in the process chamber. A separate plasma lining structure is one way of blocking direct line-of-sight for the plasma. Alternate ways of blocking line-of-sight can also be envisioned, such as a hybrid plasma confinement structure with the plasma lining structure bonded to the sidewall of the plasma confinement structure. The plasma lining structure may be made of quartz or any other dielectric material.

With the general understanding of the inventive embodiments, example details of the various implementations will now be described with reference to the various drawings. It will be apparent, that the present embodiments may be practiced without some or all of these specific details. In other instances, well-known process operations have not been described in detail in order not to unnecessarily obscure the present embodiments.

FIG. 1 illustrates a process module 100 that is configured to perform a plasma etch on a wafer surface. In one implementation, the process module 100 may be a capacitive coupled plasma processing system. The capacitive coupled plasma processing system, in addition to other hardware (e.g., computer/controller, etc.), includes a process chamber (or simply referred to hereon as "chamber") 106 for generating plasma. Accordingly, the chamber 106 may be a capacitively coupled dielectric chamber and includes an upper electrode 110, such as a showerhead, and a lower electrode (i.e., wafer support module) 104, such as a pedestal or an electrostatic chuck (ESC). In the implementation shown in FIG. 1, the showerhead 110 is shown to be grounded, and the wafer support module 104 is coupled to a plurality of RF power sources **124*a*-124*d*. In an alternate implementation, the showerhead 110 may be biased or may be coupled to a second RF power source (not shown) and may be powered. In one implementation, the showerhead 110 may include an inner showerhead 110*a* and outer showerheads 110*b* disposed on either side of the inner showerhead 110*a*. The outer showerheads 110*b*, for instance, may be used to extend the plasma region beyond an edge of a wafer received on the wafer support module 104. The showerhead 110 is connected to one or more gas sources 128, which are, in turn, coupled to a controller 122**.

The controller 122 may generate a signal to cause the RF power sources 124*a*-124*d* to provide RF signals to power the wafer support module 104, and the gas source(s) 128 to inject the desired process gas(es) into a plasma region 120 of the chamber 106 for generating the plasma. The desired process gas(es) may be based on a process recipe used in the chamber 106, which is controlled by the controller 122. A plasma is generated in the plasma region 120 defined between the upper electrode (i.e., a showerhead) 110 and the lower electrode (wafer support module) 104, using the process gas(es) injected into the chamber 106 and the RF power provided by the RF power sources 124*a*-124*d*. The plasma may be used to etch the surface of the wafer or volatilize deposits formed on different surfaces of the chamber 106.

An edge ring 132 is disposed on the wafer support module 104 such that it is adjacent to the wafer 102, when the wafer is received on the wafer support module 104. A chamber sidewall extends along the lateral length of the chamber 106. An access window (not shown) defined along the chamber sidewall of the chamber 106 is used to move the wafer into and out of the chamber 106. A plasma confinement structure 140, such as a C-shroud, is defined between the upper electrode 110 and the lower electrode (i.e., wafer support module) 104, and is used to confine the plasma within the plasma region 120. The C-shroud 140 includes a top section, a bottom section and a vertical section representing a sidewall. The sidewall extends between a first end of the top section and a first end of the bottom section. A second end of the top section is coupled to a bottom side surface of the upper electrode 110, and a second end of the bottom section of the C-shroud is coupled to a ground ring 133. In some implementations, the ground ring 133 may be connected to the bottom section of the C-shroud through a flexible conductive strap.

The RF power sources 124*a*-124*d* may be configured to supply RF power of different frequencies to power the lower electrode in order to generate the plasma. In some implementations, RF power can be delivered at 400 kilo hertz (KHz), 2 megahertz (MHz), 27 MHz and/or 60 MHz, or combinations thereof. Of course, these frequencies are provided as examples and other frequencies that are conducive for the generation of the plasma may also be used. The RF power is provided to the chamber 106 via corresponding match networks 125*a*, 125*b*. The plasma generated by the RF power tries to find the least resistive path to ground. High frequency RF signals, such as the 2 MHz, 27 MHz, and 60 MHz frequency signals, take the shortest path to ground by going through the upper electrode (110*a*, 110*b*), down through the sidewall of the C-shroud 140, and ground ring 133 to ground, as shown by broken-line 103. In some cases, a portion of the high frequency RF plasma may also follow a horizontal "line-of-sight" path to the sidewall of the C-shroud 140. For the low frequency RF signal, such as the 400 KHz signal, most of the RF plasma follows the horizontal line-of-sight toward the sidewall of the C-shroud 140, as shown by broken line 107. The sidewall provides the large grounded surface for the majority of the plasma, while some portion of the plasma goes through the upper electrode and some other portion of the plasma escapes through the slots defined in a bottom section of the C-shroud 140. The horizontal path taken by the RF plasma causes an increase in plasma density along the edge of the wafer resulting in significant tilt of devices being formed in the wafer, especially the devices formed at the edge and extreme edge of the wafer. The tilt in the devices affects the tilt specification of the entire wafer surface.

To control the tilt and to meet the tilt specification for the wafer, the line-of-sight of the plasma to ground is blocked by inserting a plasma lining structure along the inside surface of at least a sidewall of the plasma confinement structure (i.e., C-shroud) 140. The plasma lining structure is made of quartz, in one implementation. In another implementation, the plasma lining structure is coated with dielectric material. The plasma lining structure significantly suppresses the plasma density inside the C-shroud 140, especially at the wafer edge. This modification of the plasma density causes an improvement in etch rate uniformity locally along the wafer edge region, which in turn improves tilt profile in the wafer edge region.

The plasma lining structure provides a local tilt control that is better than the amount of improvement provided by the traditional dynamic "knobs" or settings that were designed to adjust the process chamber attributes, or process recipe related attributes. Independently tuning the frequency of the RF power resulted in achieving better global tilt control but had minimal impact on the local tilt control. The plasma lining structure, on the other hand, provided improved local tilt control not only at the wafer edge, but in other regions of the wafer.

A pump 126 is coupled to the chamber 106 to pump the process gas(es) and/or by-products released during the etch operation, out of the chamber 106. The pump 126 is coupled to the controller 122 to control the functioning of the pump 126.

The controller 122 includes a processor, memory, integrated circuits, software logic, hardware logic, input and output subsystems. The controller is configured for receiving instructions, issuing signals/instructions, enabling end-point measurements, communicating with various components of the chamber 106, monitoring and controlling the various aspects of the etch operations carried out within the chamber 106. The controller 122 may be part of substrate processing system, such as a cluster tool, that includes a plurality of chambers including chamber 106. As a result, the controller 122 may be coupled to each chamber within the cluster tool in order to individually communicate with, monitor and control the various aspects of process operations carried out within the respective chamber of the cluster tool. The controller 122 includes one or more recipes including multiple set points for various operating parameters for the different processes performed within the different chambers of the cluster tool. The various operating parameters may correspond to voltage, current, frequency, pressure, flow rate, power, temperature, etc. The controller, depending on the processing requirements and/or the type of system, may be programmed to control various process operations. Some of the process operations include delivery of process gas(es), temperature settings (e.g., heating and/or cooling), pressure settings, vacuum settings, power settings, radio frequency (RF) generator settings, RF matching circuit settings, frequency settings, flow rate settings, fluid delivery settings, positional and operational settings, settings to transfer a wafer into and out of a chamber and other transfer modules and/or load locks connected to or interfaced with a specific modules of the cluster tool.

The integrated circuits of the controller 122 may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), define operational parameters for carrying out a particular process, such as an etch operation, on or for the wafer or to a system. The operational parameters may, in some implementations, be part of a recipe defined by process engineers to accomplish one or more processing steps. The processing steps may include forming layers, removing layers, depositing materials, such as metals, oxides, silicon, silicon dioxide, etc., on surface of the wafers, during the fabrication of one or more circuits, and/or dies on the wafer.

The controller, in some implementations, may be a part of or coupled to a computer that is integrated with or otherwise networked to the system. For example, the controller may be in the "cloud" or all or a part of a fab host computer system, which can allow for remote access and control of the processing operations of a cluster tool (i.e., substrate processing system) for defining circuits on the wafer. The computer may enable remote access to the system to monitor progress of current fabrication operations. The computer may also examine a history of past fabrication operations, examine trends or performance metrics from a plurality of fabrication operations, to change parameters of current processing, to set processing steps to follow a current fabrication operation, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more process operations. It should be understood that the parameters may be specific to the type of process to be performed and the type of cluster tool or process module(s) that the controller is configured to interface with or control. The controller may be distributed, such as by comprising one or more discrete controllers that are networked together and working towards a common purpose, such as the processes and controls described herein. An example of a distributed controller for such purposes would be one or more integrated circuits of a chamber 106 in communication with one or more integrated circuits located remotely (such as at the platform level or as part of a remote computer) that combine to control a process in the chamber 106.

In addition to the process module 100 for etching wafers, the substrate processing system may include, without limitation, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor devices.

As noted above, depending on the process step or steps to be performed by the tool, the controller might communicate with one or more of other tool circuits or modules, other tool components, cluster tools, other tool interfaces, adjacent tools, neighboring tools, tools located throughout a fabrication facility, tools within a factory, a main computer, another controller, or tools used in material transport that bring containers of wafers to and from tool locations and/or load ports in a semiconductor manufacturing facility.

Figure 2A:
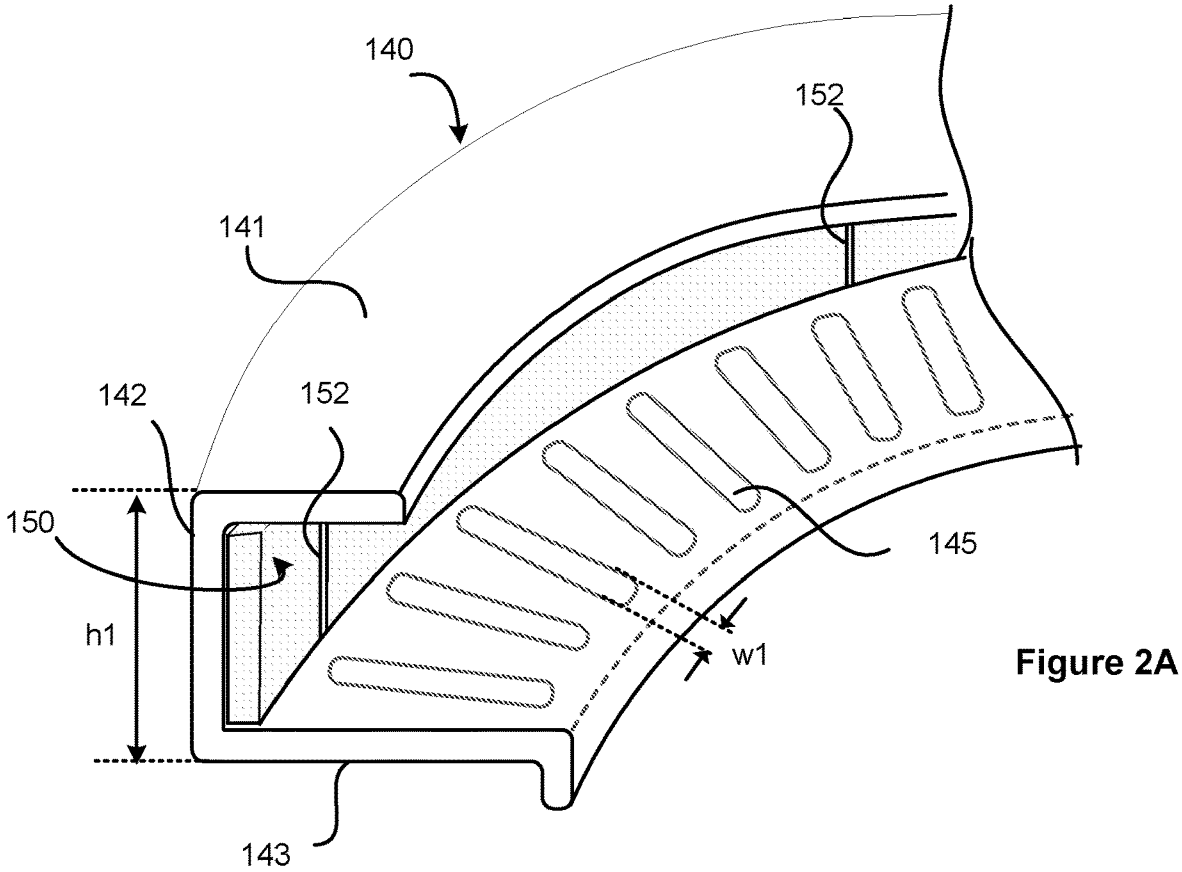
FIG. 2A illustrates a cross-sectional view of a plasma confinement structure, such as a C-shroud, with an plasma lining structure disposed along a sidewall of the C-shroud, in one implementation.
Figure 2B:
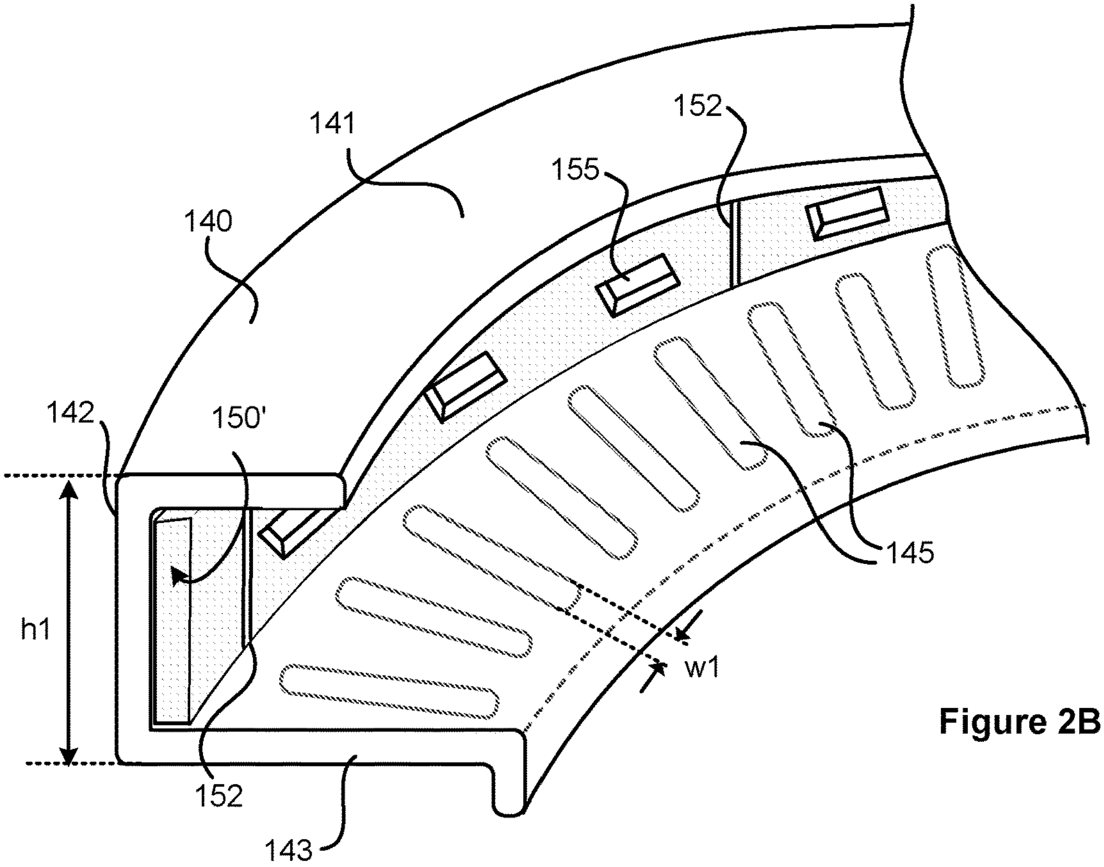
FIG. 2B illustrates a cross-sectional view of a plasma confinement structure (e.g., C-shroud), with a plasma lining structure disposed along a sidewall of the C-shroud, wherein the plasma lining structure includes a plurality of windows, in an alternate implementation.

FIGS. 2A and 2B illustrate cross-sectional views identifying various components of a plasma confinement structure, such as a C-shroud 140, with a plasma lining structure 150 disposed between a sidewall of the plasma confinement structure (i.e., C-shroud) 140 and a plasma region 120. The plasma lining structure 150 is used to provide local tilt control. The C-shroud 140 shown in FIGS. 2A and 2B is a circular structure that encircles a plasma region 120 in order to substantially confine the plasma generated within the chamber 106 to the plasma region 120. The C-shroud 140 includes a top section 141, a bottom section 143 and a vertical section represented by a sidewall 142 that extends between first ends of the top section 141 and the bottom section 143 of the C-shroud 140, respectively. In one implementation, the bottom section 143 of the C-shroud 140 includes a downward extension at the second end. The downward extension connects to a ground ring 133 defined in the lower electrode of the chamber 106, through a flexible conductive strap. A plurality of slots 145 are defined along the bottom section 143 of the C-shroud 140. The slots 145 are sized to provide unhindered path for the plasma and by-products to escape the plasma region 120. In some implementations, a width 'w1' of each slot 145 is defined to be between about 1.5 mm and about 3 mm. An outer height 'h1' of the sidewall 142 of the C-shroud, in some implementations, is defined to be between about 1" and about 3". It should be understood that the outer height h1 of the sidewall 142 of the plasma confinement structure (e.g., C-shroud) 140 may vary from one chamber 106 to another and sometimes may depend on the type of process performed in the chamber 106. Similarly, the width w1 may be defined based on the type of process gas used in the process chamber.

FIG. 2A illustrates a segment of the plasma confinement structure (e.g., C-shroud) 140 with the plasma lining structure 150 provided to line at least the inner surface of the sidewall 142 of the plasma confinement structure 140 (i.e., C-shroud) and positioned between the sidewall 142 of the C-shroud 140 and the plasma region 120, such that the inner surface of the plasma lining structure 150 directly faces the plasma region 120. The sidewall 142 is annular in shape. The plasma lining structure 150 is made of a plurality of sections that conform to and cover one or more portions of the inner surface of the sidewall 142 of the C-shroud. In some implementations, the plurality of sections includes two or more arc-shaped sections, with the arc profile matching the circular profile of the C-shroud 140. The plurality of sections of the circular plasma lining structure 150 extends for a height to line the inner surface of the vertical sidewall 142. In one implementation, the two or more arc-shaped sections of the plasma lining structure 150 forms a continuous ring that fully covers the entire sidewall 142 of the C-shroud 140. Since the shape of the C-shroud 140 is such that the inner radius of the sidewall 142 of the C-shroud 140 is greater than the inner radii of both the top section 141 and bottom section 143 of the C-shroud 140, the two or more sections of the plasma lining structure 150 are assembled inside the chamber 106 so as to line the inside surface of the sidewall 142.

In some implementations, a pair of adjacent arc-shaped sections are designed to interface together to form an interlocking interface 152. Additionally, each arc-shaped section may be coupled to the bottom section 143 or top section 141 or sidewall 142 of the C-shroud 140 using coupling or interlocking mechanism, such as securing pins or alignment pins or mating extensions defined in the respective sections of the C-shroud 140. The coupling mechanism is not restricted to mating extensions, alignment pins or securing pins but can be extended to include other types/forms of coupling. The interlocking and/or the coupling mechanism enable a pair of adjacent sections of the plasma lining structure to be aligned with slots of the C-shroud 140. Additionally, the two or more sections are clocked to each other and to the C-shroud to ensure that each section is received at specific position and orientation, so as to allow for repeatable installation with a well-defined orientation of each section.

In some implementation, the plasma lining structure 150 is made of quartz so as to reduce RF coupling. The material used for the plasma lining structure 150 is not restricted to quartz but could use any other material that has the same or similar thermal and conductive properties as the quartz. For example, the plasma lining structure 150 may be made of a dielectric material. The dielectric material is a non-metallic insulation material. The C-shroud 140, in the implementation illustrated in FIG. 2A, is made of silicon. The plasma lining structure 150 is disposed so that the two or more sections directly faces the plasma region 120. As a result, the plasma lining structure 150 is a consumable part as it is constantly exposed to the plasma in the chamber 106.

FIG. 2B illustrates an alternate implementation of the plasma lining structure 150' that is used to line the inner surface of the sidewall 142 of the C-shroud 140. The plasma lining structure is made of a plurality of sections, with each section having a plurality of segments. The plurality of segments may include a vertical segment that is configured to cover the vertical section 142 of the C-shroud 140, a top segment that is configured to cover an underside surface of the top section 141 of the C-shroud 140, and a bottom segment that is configured to cover a top surface of the bottom section 143 of the C-shroud 140. The bottom segment may include a plurality of liner slots that align with the plurality of slots defined on the bottom section of the C-shroud 140, when the plasma lining structure 150' is assembled inside the process chamber. In this implementation, each section of the plasma lining structure 150' includes one or more windows 155 defined along the vertical segment. The windows 155 provide a direct path for the RF plasma to ground by exposing corresponding portions of the sidewall 142 of the C-shroud aligning with the windows 155, to the plasma. The windows 155 are sized to expose a desired amount of the grounded surface of the sidewall 142 to the plasma. In some implementations, the number and location of the windows 155 is determined by the level of tuning that is to be performed over different regions of the wafer so as to have an optimal plasma density over the different regions of the wafer.

Figure 3B:
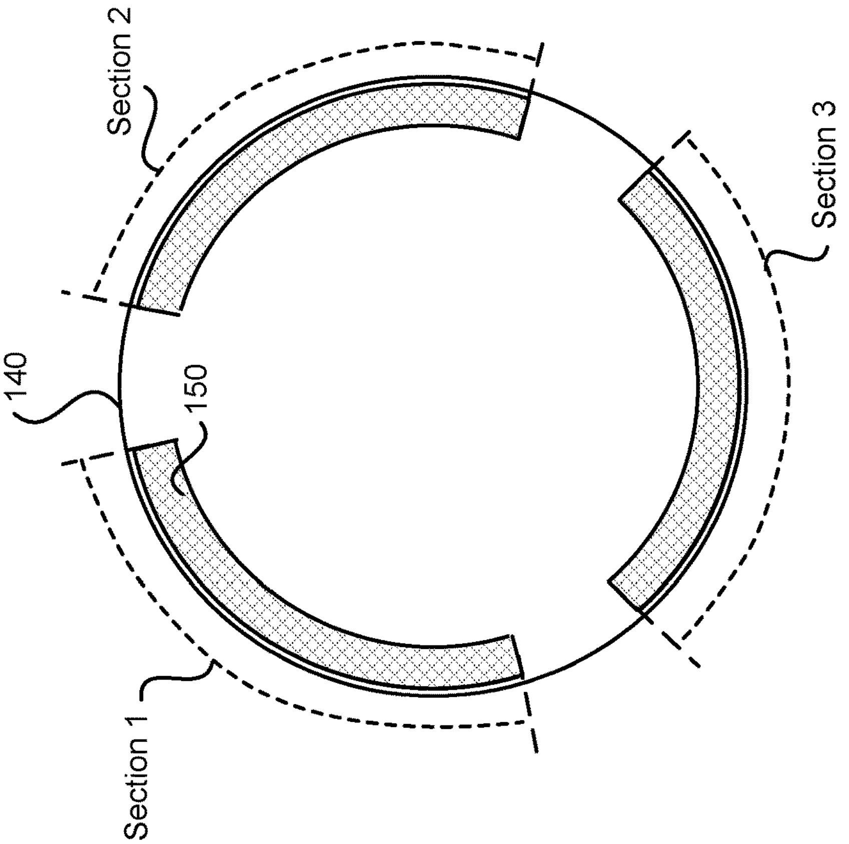
FIG. 3B illustrates a top view of a plasma confinement structure (e.g., C-shroud) with arc-shaped sections of a plasma lining structure that is spaced apart from one another, in accordance with an alternate implementation.
Figure 3A:
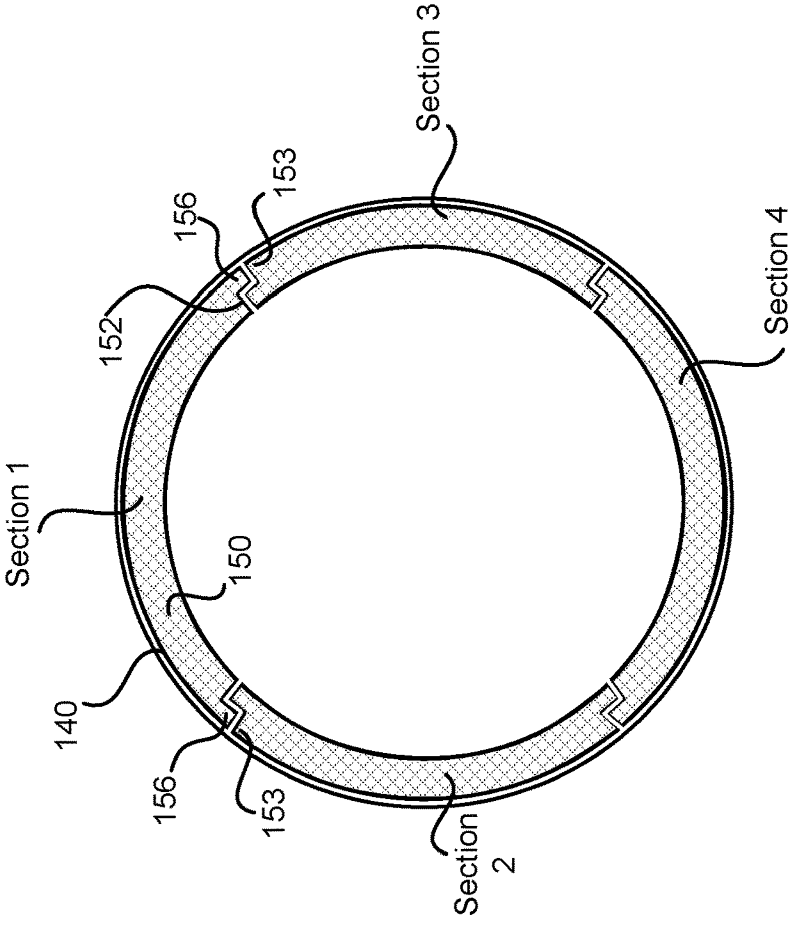
FIG. 3A illustrates a top view of a plasma confinement structure (e.g., C-shroud) with arc-shaped sections of a plasma lining structure that covers a sidewall of the C-shroud, in accordance with an implementation.

FIGS. 3A and 3B provide overhead, perspective views of a C-shroud 140 with a plasma lining structure 150 defined to line the inner surface of the sidewall 142, in some example implementations. The plasma lining structure 150 includes two or more sections that are disposed to match or conform to a shape of the plasma confinement structure 140. The plasma confinement structure (e.g., C-shroud) 140, in one implementation, is annular and the plurality of sections of the plasma lining structure 150 are disposed to form a complete ring covering the entire sidewall 142 of the C-shroud 140. As the inner radius of the sidewall of the C-shroud 140 is greater than the radii of the top and bottom sections (141, 143) of the plasma confinement structure (e.g., C-shroud) 140, the two or more sections of the plasma lining structure 150 are received and assembled inside the process chamber. In the example of FIG. 3A, the plasma lining structure 150 is made of four sections (sections 1-4). Each section is joined to an adjacent section at an interlocking interface. For example, each of the four sections includes a lip (i.e., an extension (also referred to as a "tab")) that reliably mates with a complementary indent or recess of an adjacent section to form an interlocking interface 152. For example, section 1 may have a lip or extension 156 defined along the outer diameter portion. The adjacent piece, section 2, may have a complementary indent or recess 153 defined on the inner diameter portion so that the lip 156 defined at a first end of section 1 can interface with the complementary indent 153 defined at a first end of section 2 to form the interlocking interface 152. Similarly, the lip 156 defined at a second end of section 1 can interface with the complementary indent 153 of section 3. In this example, sections 2 and 3 are shown to have similar sectional profile and are disposed opposite to one another. Sections 1 and 4 are shown to have similar sectional profile and are disposed opposite to one another. Further, section 1 is adjacent to first ends of sections 2 and 3, and section 4 is adjacent to second ends of sections 2 and 3. It should be noted that the number of sections of the plasma lining structure 150 is provided as a mere example and that fewer or greater number of sections may be used to line the inside surface of the sidewall 142 of the C-shroud 140. In some implementations where lips and indents are used to define interlocking interface, the number of sections may be even in number so that a lip of one section can interface with a complementary indent of an adjacent section.

FIG. 3B illustrates an alternate implementation wherein the plasma lining structure 150 includes 3 sections (sections 1-3) distributed to cover the inside surface of the sidewall 142 of the C-shroud 140. In this implementation, the sections are uniformly sized and each section is spaced apart from an adjacent section to define a gap of a certain width. Since the size of each section is small, it is easier to assemble the sections to line the inside surface of the C-shroud 140 without any need for interlocking interface. As a result, no interlocking interface is shown in FIG. 3B. Similar to the embodiment that included windows in plasma lining structure 150 (i.e., embodiment illustrated in FIG. 2B), the gap between any two neighboring or adjacent sections exposes a portion of the sidewall 142 of the C-shroud 140 to the plasma, thereby providing the plasma a direct path to ground. The number and size of the sections and a size of the gap are defined to provide the plasma with some exposure to the grounded sidewall 142 of the plasma confinement structure 140 while the majority of the grounded sidewall 142 blocks the path to ground for the plasma. The gap between a pair of neighboring or adjacent sections is shown in FIG. 3B to be significantly big to illustrate the presence of a gap. In practice, the gap may be significantly narrower so that only a small portion of the sidewall 142 of the plasma confinement structure 140 is exposed to the plasma. Further, the number of sections are provided as mere example and fewer or greater number of sections may be used to line the inside surface of the sidewall of the C-shroud 140.

FIGS. 4A-4D illustrate the various configurations of the plasma lining structure 150 that can be disposed to line the inside surface of the plasma confinement structure, such as the C-shroud 140. The plasma confinement structure 140 includes a top section 141, a bottom section 143 and a vertical section represented by a sidewall 142 that extends from a first end of the top section 141 to a first end of the bottom section 143. A second end of the top section 141 is coupled to a sidewall of the upper electrode and a second end of the bottom section 143 is coupled to a ground ring. In each of the configurations, the plasma lining structure 150 includes two or more sections that are assembled inside the chamber 106 to completely cover at least the inside surface of the sidewall 142 of the C-shroud 140 or include gaps between a pair of adjacent sections. Each section of the plasma lining structure 150 is arc-shaped to match or conform to the shape of the C-shroud 140, which is circular, in one implementation. Each section may include a plurality of segments including a vertical segment that extends for a height. The height of the vertical segment is based on the inner height of the sidewall 142 of the C-shroud 140, so that when the sections are assembled inside the chamber 106, each section substantially covers a portion of the sidewall of the C-shroud 140 where the section is disposed. The inner surface of the plasma lining structure 150, due to its location in the chamber 106, is constantly exposed to the plasma in the chamber 106 and is therefore a consumable part with a defined lifetime. After expiration of the lifetime, the existing plasma lining structure 150 is discarded and a new plasma lining structure 150 is assembled in its place within the C-shroud 140.

Figure 4A:
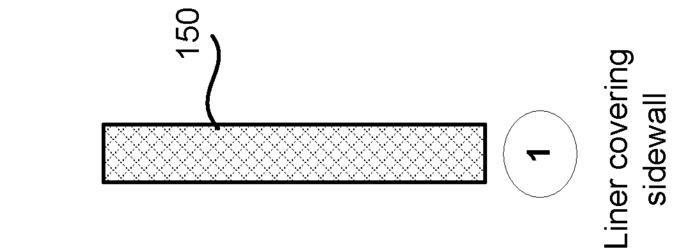
FIGS. 4A-4D illustrate different configurations of the plasma lining structure used for lining the inside surface of a plasma confinement structure (e.g., C-shroud), in accordance with different implementations.

FIG. 4A illustrates one implementation wherein the plasma lining structure 150 only includes a vertical segment that covers the entire inner surface of the sidewall 142 of the C-shroud 140. This is similar to the embodiments discussed with reference to FIGS. 2A-2B and 3A-3B. The height of the vertical segment of the plasma lining structure 150 is configured to be less than an inside height of the sidewall of the C-shroud 140, such that a gap is defined between the top of the plasma lining structure 150 and an underside surface of a top section 141 of the C-shroud 140 and this gap may be small and sufficient to enable placement and assembly of the plasma lining structure 150 within the chamber 106.

Figure 4B:
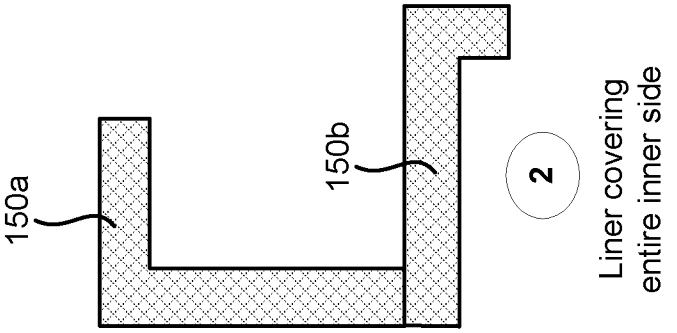

FIG. 4B illustrates an alternate implementation wherein the plasma lining structure 150 covers the entire inside surface of the plasma confinement structure (i.e., C-shroud) 140 including the underside surface of the top section 141, the sidewall 142, and the top surface of the bottom section 143. The plasma confinement structure 140 is annular in shape. In order for the plasma lining structure 150 to be assembled easily to cover the inside surface of the C-shroud 140, the plasma lining structure 150 is made of two or more sections. For example, the plasma lining structure 150 may be made of four sections (sections 1-4) that are disposed to conform to the annular shape of the plasma confinement structure so as to form a complete ring, as shown in FIG. 3A, with each section covering a portion of the inner surface of the plasma confinement structure 140. Alternately, the plasma lining structure 150 may be made of sections 1-3 that are disposed along the annular shape of the plasma confinement structure 140 with a gap defined between any pair of adjacent sections, as shown in FIG. 3B, with each section covering a portion of the inner surface of the plasma confinement structure 140. Each section may include a plurality of segments. In the example illustrated in FIG. 4B, each section is made of two segments—a first segment 150*a* that covers both an underside surface of the top section 141 and the inner surface of the sidewall 142 of the C-shroud 140, and a second segment 150*b* that covers a top side of the bottom section 143 and a downward extension that connects the C-shroud 140 to the ground ring 133. Each segment is coupled to the corresponding surface of the C-shroud 140 using coupling mechanism that may include mating extensions, securing pins, etc. In this implementation, the second segment 150*b* includes a plurality of liner slots that align with the corresponding slots defined in the bottom section 143 of the C-shroud 140.

In an alternate implementation (not shown), each section may include three segments—a top segment that covers the underside surface of the top section 141 of the C-shroud 140, a vertical segment that covers the inner surface of the sidewall (i.e., vertical section) 142, and a bottom segment that covers the top side of the bottom section 143 and the downward extension of the C-shroud 140. The bottom segment includes a plurality of liner slots that align with corresponding slots in the bottom section 143 of the C-shroud 140. The number of sections and number of segments in each section are given as an example and that fewer or greater number of sections, segments may also be envisioned. Securing pins, or alignment pins, or mating extensions, may be used to lock the sections/segments with one another and with the corresponding surfaces of the C-shroud 140.

Figure 4C:
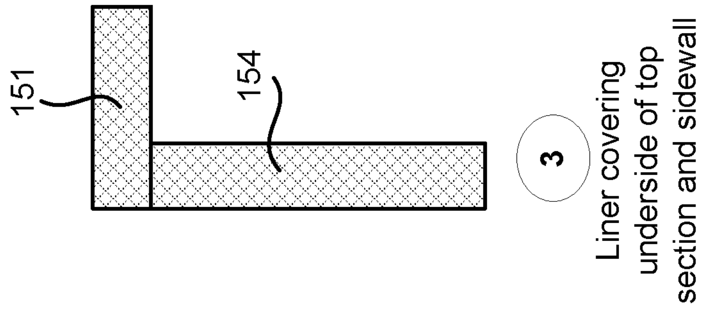

FIG. 4C illustrates an alternate configuration in which the plasma lining structure 150 is designed to cover only the underside surface of the top section 141 and the inside surface of the sidewall 142 of the C-shroud 140. In this configuration, each section of the plasma lining structure 150 is made of two segments, with a first segment 151 covering the underside surface of the top section 141 and the second segment 154 covering the inside surface of the sidewall 142 of the C-shroud 140. In the configuration illustrated in FIG. 4C, each segment is defined to cover a particular planar portion of the C-shroud 140. For example, the first segment 151 covers a horizontal portion of the C-shroud 140 and the second segment 154 covers the vertical sidewall of the C-shroud 140. The implementations are not restricted to the configuration of FIG. 4C but can include additional segments for the second segment 154 that covers the inside surface of the sidewall 142. For example, the second segment 154 may include a first sub-segment and a second sub-segment that interface together to form an interlocking interface.

Figure 4D:
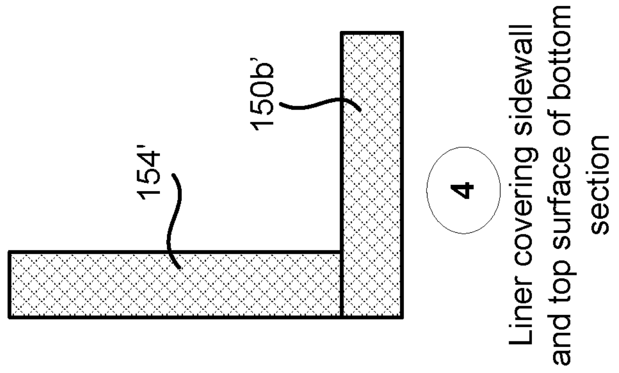

FIG. 4D illustrates a different configuration in which the plasma lining structure 150 is designed to cover only the top surface of the bottom section 143 and the inside surface of the sidewall 142 of the C-shroud 140. As with the configuration discussed with reference to FIG. 4B, a bottom section of the plasma lining structure 150 includes a plurality of liner slots that align with the corresponding slots defined on the bottom section 143 of the C-shroud 140. Further, each section of the plasma lining structure 150 may include two or more segments. For example, a first segment 150*b*' may cover the top surface of the bottom section 143 and a second segment 154' may cover the inside surface of the sidewall 142 of the C-shroud 140. Coupling mechanisms are used to reliably lock the two or more sections with one another and with the corresponding surfaces of the C-shroud 140. Each of the various configurations illustrated in FIGS. 4A-4D define the plasma lining structure 150 covering at least the inner surface of the sidewall 142 of the C-shroud 140 with some configurations covering additional inner surfaces of the C-shroud 140. The various configurations discussed herein block at least the horizontal line-of-sight for the plasma to the sidewall 142 of the C-shroud 140 that provides a direct path to ground.

The various configurations illustrated in FIGS. 4A-4D define a plasma lining structure 150 in which the two or more sections are disposed to form a complete ring covering at least the entire inside surface of the sidewall 142 of the C-shroud 140. Alternately, the two or more sections may be disposed along the circular wall of the C-shroud 140 with a gap between a pair of adjacent sections. Additionally, these configurations may also be extended to implementations wherein one or more windows are defined in the vertical section of the plasma lining structure 150 that covers the sidewall 142 of the C-shroud 140, as well.

Figure 5B:
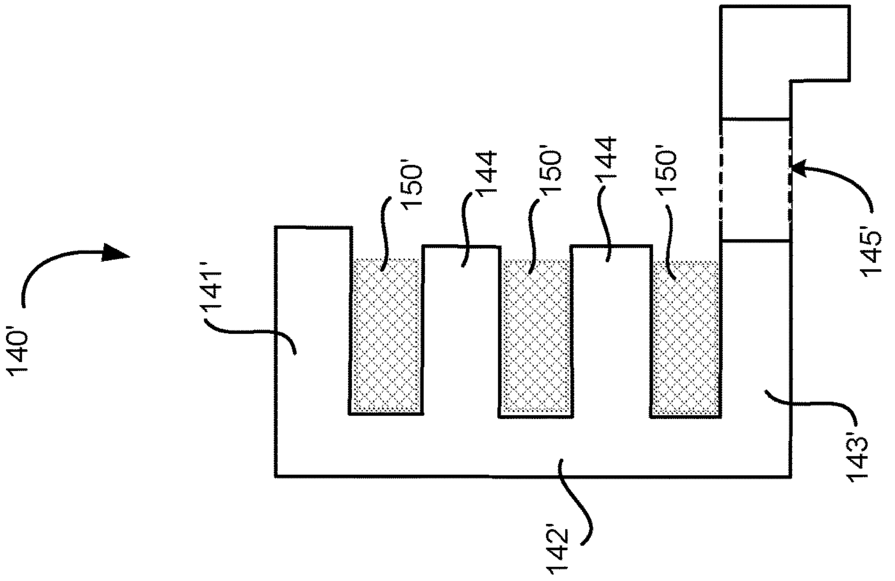
FIG. 5B illustrates an example of an alternate design of a plasma confinement structure in the form of an E-shroud lined with a plasma lining structure, in accordance with one implementation.
Figure 5A:
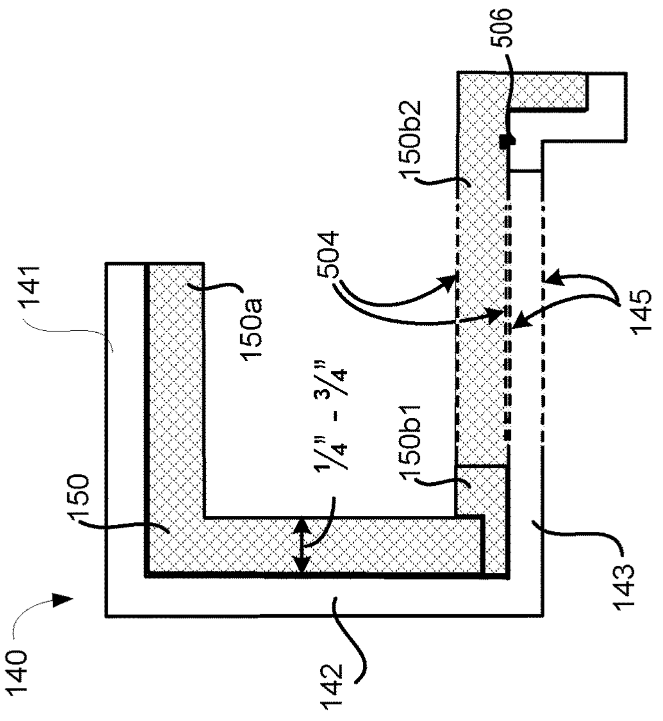
FIG. 5A illustrates an example design of a plasma confinement structure in the form of a C-shroud lined with an plasma lining structure, in accordance with one implementation.

FIG. 5A illustrates a vertical cross-sectional view of a plasma lining structure 150 with multiple sections that are assembled to cover the entire inside surface of the plasma confinement structure 140, in one implementation. The plasma confinement structure 140 is shown as a C-shroud 140. The plasma lining structure 150 covering the inside surface of the C-shroud 140 is shown to include three segments. For example, the first segment 150*a* covers the underside surface of the top section 141 and the inside surface of the sidewall 142 of the C-shroud 140. The second segment 150*b*1 is defined to cover a portion of a top surface of the bottom section 143 of the C-shroud 140. The portion of the top surface covered by the second segment 150*b*1 extends from the sidewall 142 to the beginning of the section that includes the slots 145. A third segment 150*b*2 is defined to cover the remaining portion of the top surface of the bottom section 143 and the downward extension that connects the C-shroud 140 to the ground ring 133. In the implementation illustrated in FIG. 5A, the second segment 150*b*1 may include an indentation in the portion that is adjacent to the sidewall 142 of the C-shroud 140 into which a bottom portion of the first segment 150*a* is received. The third segment 150*b*2 includes a plurality of liner slots (shown as broken lines) 504 that are aligned with corresponding slots 145 (shown as broken lines) in the bottom section 143 of the C-shroud 140. Securing pin 506 is used to align the third section 150*b*2 to the bottom section 143 of the C-shroud 140 so as to center the liner slots 504 defined in the third section 150*b*2 and the slots 145 of the bottom section 143 of the C-shroud 140. In some implementations, a total of 3 securing pins may be used to align the various sections of the plasma lining structure 150 to the C-shroud 140. In the implementations where the sidewall 142 is defined as a separate section than the bottom section 143 of the C-shroud 140, there may be fasteners to secure the sidewall 142 to the bottom section 143. The downward extension of the C-shroud 140 may have a surface profile and the downward extension of the third segment 150*b*2 of the plasma lining structure 150 is designed to match or complement the surface profile of the downward extension of the C-shroud 140.

In the implementations where the plasma lining structure 150 covers the entire inside surface of the C-shroud 140 (e.g., the implementations illustrated in FIGS. 4B and 5A), the C-shroud 140 may be made of Aluminum and the plasma lining structure may be made of quartz. The quartz is a non-metallic insulation material. In the implementations where the plasma lining structure 150 covers only a portion of the inner surface of the C-shroud (e.g., the implementations illustrated in FIGS. 4A, 4C and 4D), the C-shroud may be made of Silicon, while the plasma lining structure 150 may be made of quartz. Alternately, the plasma lining structure may be made of any other dielectric material (i.e., non-metallic insulation material). The thickness of the C-shroud 140 is defined so as to sufficiently suppress the plasma but not block ventilation for any by-products and process gas(es) to escape. Similarly, the thickness of the plasma lining structure 150 may be defined to ensure that the plasma lining structure 150 is able to sufficiently block the horizontal line-of-sight for the RF plasma generated within the chamber 106. In one implementation, the thickness of the plasma lining structure 150 may be between about ¾" to about ¾". In the case where the plasma lining structure 150 lines the entire inner surface of the C-shroud 140, or just the bottom section 143 and the sidewall 142, or just the top section 141 and the sidewall 142, the thickness of the plasma lining structure 150 may be uniform along the different portions. In other implementations, the thickness of the plasma lining structure 150 may be of a first thickness along the sidewall 142 and of a second thickness along the surface covering the underside surface of the top section 141 or top surface of the bottom section 143 of the C-shroud 140. In such implementations, the first thickness is greater than the second thickness and is defined to sufficiently block the RF plasma's path to grounded sidewall surface 142 of the C-shroud 140.

The thickness of the plasma lining structure 150 is defined to ensure that the plasma lining structure 150 maintains a desired amount of tolerance. In the implementation where the plasma lining structure 150 only covers the inside surface of the sidewall 142 of the C-shroud 140, a gap may exist between the top surface of the plasma lining structure 150 and the underside surface of the top section 141 of the C-shroud 140. The gap is defined to be sufficiently small to enable placement and assembly of different sections of the plasma lining structure 150 inside the chamber 106. In some implementations, the gap may be between about $1/12$" to about $1/20$" in size, in one implementation. The height of the plasma lining structure 150 is defined by a height of the C-shroud 140 used in the chamber 106, which may vary depending on the type of etch process that is being performed in the chamber 106.

FIG. 5B illustrates a cross-sectional view of an alternate implementation of a plasma confinement structure. In this implementation, the plasma confinement structure is in the form of an "E-shroud" 140'. The E-shroud 140' includes a top section 141', a bottom section 143' and a sidewall 142' extending between first ends of the top and the bottom sections (141', 143'). A second end of the top section 141' is coupled to a bottom side surface of the upper electrode and a second end of the bottom section is coupled to a ground ring. The top and bottom sections of the E-shroud 140' are similar to the top and bottom sections (141, 143) of the C-shroud 140. The sidewall 142' however differs from the sidewall 142 of the C-shroud 140. The sidewall 142' of the E-shroud 140' includes a plurality of annular protrusions 144 that extend horizontally inward from the inner surface of the sidewall 142' toward the center of the chamber 106. The annular protrusions 144 are disposed uniformly along the length of the sidewall 142' of the E-shroud 140'. A length of the annular protrusions 144 extending inward is defined so as to provide an unhindered path for the plasma to escape through the liner slots defined in the bottom section 143' of the E-shroud 140'. A thickness of each of the annular protrusions 144 may match the thickness of the sidewall 142' and/or top and the bottom sections (141', 143') of the E-shroud 140', in one implementation. In alternate implementation, the thickness of each of the annular protrusions 144 may be smaller or greater than the thickness of the top and bottom sections (141', 143') of the E-shroud 140'. The bottom section 143' of the E-shroud 140' includes a plurality of slots 145' to allow plasma to escape the plasma region. The length of the annular protrusions 144 may be defined so as to provide an unhindered path for the plasma to escape through the slots 145' defined along the bottom section 143' of the E-shroud 140'.

The annular protrusions 144 of the E-shroud 140' are defined such that a first space is defined between the top section 141' and an adjacent annular protrusion (i.e., annular protrusion that is immediately below the top section 141'). A second space is defined between the bottom section 143' of the E-shroud 140' and an adjacent annular protrusion (i.e., the annular protrusion that is immediately above the bottom section 143'). A corresponding third space is defined between any pair of adjacent annular protrusions.

A plasma lining structure 150' is disposed in each of the first, second and third spaces defined between the annular protrusion and the top section, the annular protrusion and the bottom section and between any pair of annular protrusions 144, to sufficiently block access to the sidewall 142' of the E-shroud 140'. In implementations where the plasma lining structure 150' is disposed in the second space defined between the bottom section and the adjacent annular protrusion, the size of the plasma lining structure 150' may be defined so as to provide a path for the plasma to escape through the slots 145'. In alternate implementation, the top surface of the bottom section 143' is kept free of any plasma lining structure 150' so as to provide an unhindered path for the RF plasma and by-products to escape the plasma region. In another alternate implementation, the plasma lining structure 150' defined on the top surface of the bottom section 143' may include liner slots that align with the corresponding slots defined in the bottom section 143'. The height of the plasma lining structure 150' is defined to be equal to the height of a portion of the sidewall between adjacent annular protrusions 144. When the plasma lining structure 150' is received on the top annular protrusion or on top of the bottom section 143', the height of the plasma lining structure 150' is defined to be equal to a height of the sidewall between the annular protrusion 144 and the top or the bottom sections (141', 143') of the E-shroud 140'. The plasma lining structure 150' is annular in shape, made of two or more sections and be configured to line the entire sidewall surface defined between each annular protrusion to form a full ring, or may be designed to have gaps between each pair of adjacent sections. When the plasma lining structure 150' is designed to form a full ring, each section may be interfaced with an adjacent section to define an interlocking interface. The interfacing may be done via coupling mechanisms, such as securing pins, alignment pins, mating surfaces, etc., defined on a backside or any other side of each section. Each section may further be coupled to corresponding surfaces of the E-shroud via securing pins, alignment pins, mating surfaces, etc. In one implementation, the mating surface may be defined to include one or more indentations defined on a top surface of the annular protrusion or top surface of the bottom section of the E-shroud, for example, and a complementary extension defined on the surface of each section of the plasma lining structure 150', for reliable mating. The indentations and the extensions are sized to ensure that each extension fits tightly into a corresponding indentation. These indentations, extensions or coupling mechanisms are used to interlock the different sections of the plasma lining structure 150' to each other and to the different surfaces of the E-shroud 140' so as to provide reliable orientation for repeatable installation.

Figure 6:
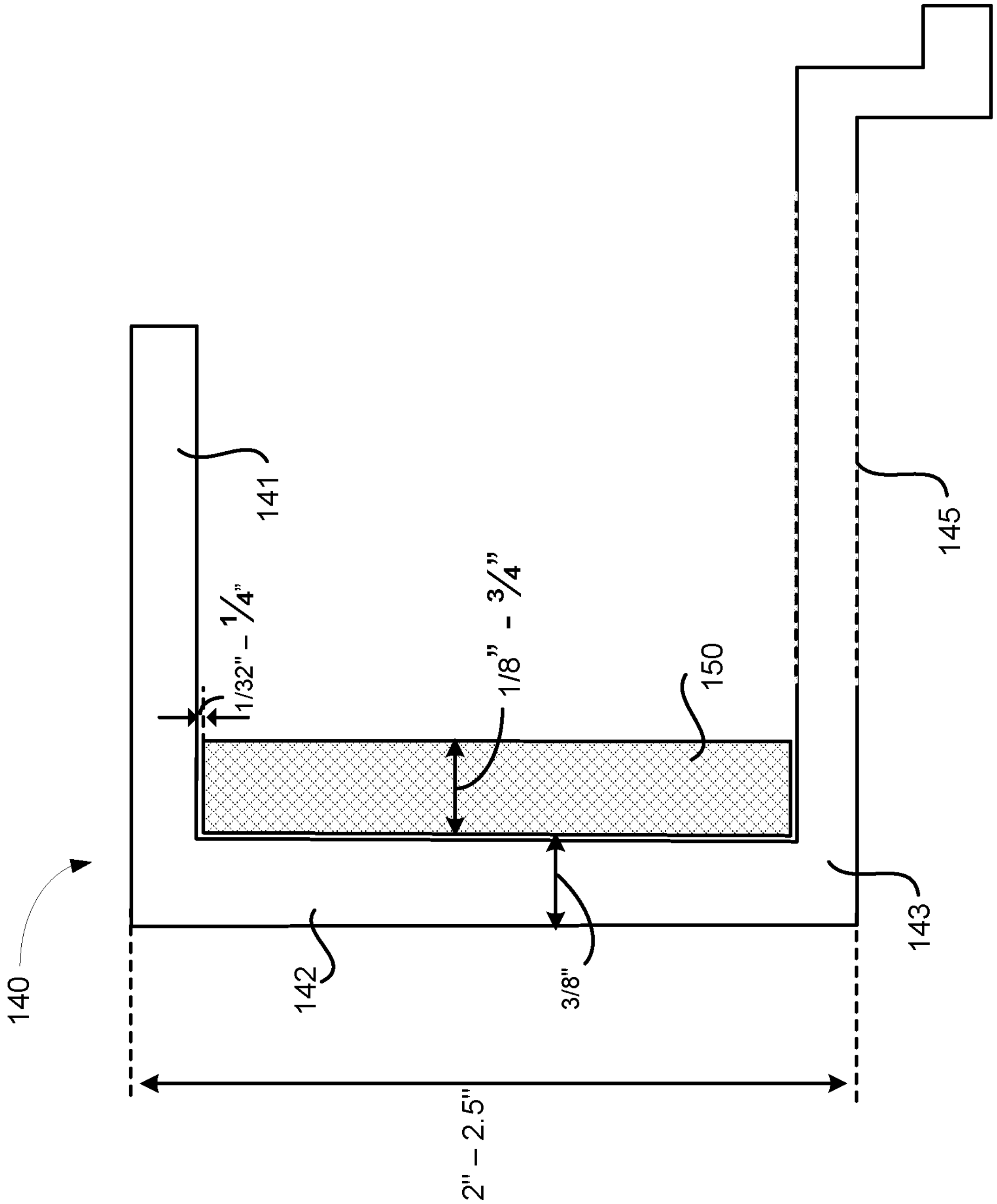
FIG. 6 illustrates a cross-sectional view of a portion of a plasma confinement structure (e.g., C-shroud) with a plasma lining structure covering a sidewall of the C-shroud identifying various dimensions of the C-shroud and the plasma lining structure, in one example implementation.

FIG. 6 illustrates a simplified cross-sectional view of the plasma lining structure 150 lining the inside surface of the sidewall 142 of the C-shroud 140. In some implementation, the width of the sidewall 142 of the C-shroud 140 is defined to be between about ¾" (i.e., 0.25") and about ¾" (i.e., 0.75"). The outer height of the sidewall 142 of an example C-shroud 140 is defined to be between about 2" and about 2.5", in one implementation. The dimensions of the C-shroud 140 are provided as a mere example and should not be considered limiting. It should be understood that different process chambers may use different dimensions of the C-shroud 140, based on the type of process performed within each process chamber. In one implementation, the width of the plasma lining structure 150 is defined to be between about ⅛" and about ¾" (i.e., 0.75"). A gap is defined between the top of the plasma lining structure 150 that lines the inside surface of the sidewall 142 of the C-shroud 140 and an underside surface of the top section 141 of the C-shroud 140. The gap is provided to allow the plasma lining structure 150 to be moved into place within the C-shroud 140. In one implementation, the gap is defined to be between about 1/32" (i.e., about 0.031") and about ¼" (i.e., about 0.25"). The aforementioned dimensions of the various components of the C-shroud 140 (i.e., plasma confinement structure) and the plasma lining structure 150 are provided as an example and should not be considered restrictive. The height and width of the C-shroud 140 may vary depending on the type of process performed and the type of process chamber in which the C-shroud 140 is defined. Consequently, the height and width of the plasma lining structure 150, and the gap between the top of the plasma lining structure 150 and the bottom surface of the top section 141 of the C-shroud 140 may vary depending on the measurements of the C-shroud 140. Although the dimensions have been provided with reference to C-shroud 140, similar dimensions may be envisioned for the E-shroud 140'.

The various implementations discussed herein provide local tilt control for the 3D devices defined on a wafer, by addressing the density differential across different regions of the wafer. The density differential is addressed by providing a quartz liner to block the line-of-sight to the grounded surface (i.e., sidewall of the C-shroud 140) for the plasma. Blocking the line-of-sight to the grounded surface leads to significant suppression of the plasma density along the edge and extreme edge regions of the wafer. This results in local tilt control of the 3D devices at the edge and extreme regions of the wafer. The amount of suppression of the plasma density at the different regions of the wafer may be tuned by adding windows or by defining gaps in the plasma lining structure 150. The windows or gaps provide access to small portions of the grounded sidewall of the C-shroud 140. Access to small portions of the grounded sidewall results in some of the plasma finding a direct path to ground leading to adjustment in the plasma density in the region proximal to the windows/gaps (i.e., edge and extreme edge regions of the wafer), while the majority of the plasma's path to ground is blocked by the plasma lining structure 150 covering the majority of the sidewall of the C-shroud 140. The number and size of windows or size of gaps may be defined based on amount of adjustment to the plasma density needed in the different regions including the edge region of the wafer.

The number of windows provided may be even in number to provide symmetry for the plasma lining structure 150. It should be understood that the number of windows is limited to ensure that a majority of the inner surface of the sidewall of the C-shroud 140 is covered by the plasma lining structure 150 in order to sufficiently block the RF plasma's return path to ground. Depending on the type of etching that is to be performed in the process chamber and the amount of plasma suppression needed at the edge or other regions of the wafer, the plasma lining structure 150 with appropriate number of windows may be selected to line at least the inside surface of the sidewall of the C-shroud 140. Reducing the RF coupling by selecting the appropriate plasma lining structure 150 results in noticeable improvement in the tilt profile of the 3D devices across the wafer edge. The tilt profile of the 3D devices at the edge match the tilt profile of the 3D devices in the center of the wafer. With the increased aspect ratio of the devices defined on the wafer surface, improving the tilt profile of the 3D devices at the edge region results in better yield.

Figure 7:
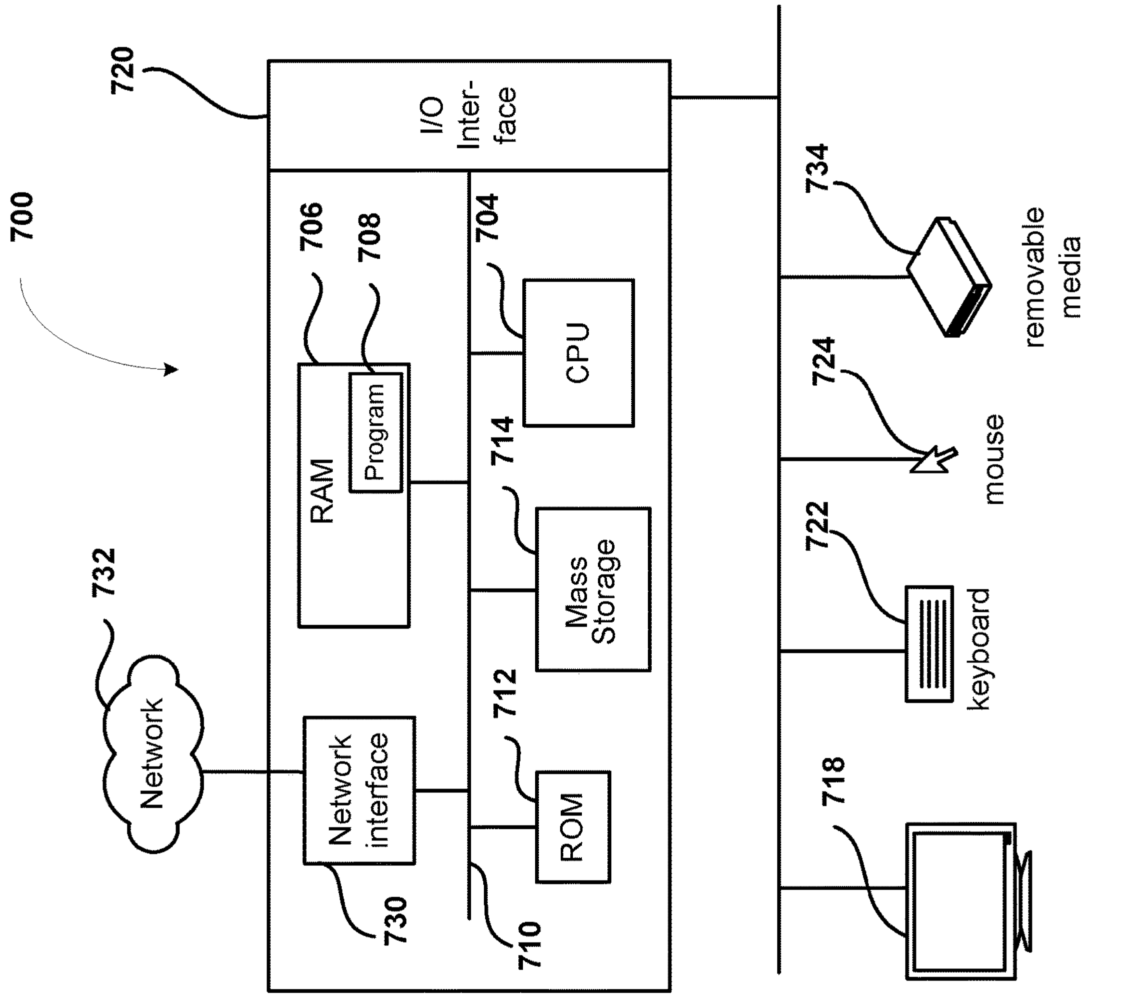
FIG. 7 is a simplified schematic diagram of a computer system that is used for tuning an edge of a wafer, in accordance with one implementation.

FIG. 7 is a simplified schematic diagram of a computer system 700 that may be coupled to the process chamber to control process recipes and functioning of different components of the present disclosure. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 704, which is coupled through bus 710 to random access memory (RAM) 706, read-only memory (ROM) 712, and mass storage device 714. System controller program 708 resides in RAM 706, but can also reside in mass storage device 714.

Mass storage device 714 represents a persistent data storage device such as a floppy disc drive or a fixed disc drive, which may be local or remote. Network interface 730 provides connections via network 732, allowing communications with other devices. It should be appreciated that CPU 704 may be embodied in a general-purpose processor, a special purpose processor, or a specially programmed logic device. Input/Output (I/O) interface provides communication with different peripherals and is connected with CPU 704, RAM 706, ROM 712, and mass storage device 714, through bus 710. Sample peripherals include display 718, keyboard 722, cursor control 724, removable media device 734, etc.

Display 718 is configured to display the user interfaces described herein. Keyboard 722, cursor control (e.g., a mouse) 724, removable media device 734, and other peripherals are coupled to I/O interface 720 in order to communicate information in command selections to CPU 704. It should be appreciated that data to and from external devices may be communicated through I/O interface 720. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they can occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma lining structure for use with a plasma confinement structure having a sidewall in a vertical orientation and with an annular shape, the sidewall having an inner surface, comprising:

a plurality of sections configured to conform to and cover at least one or more portions of the inner surface of the sidewall, wherein the plurality of sections are configured for positioning between a plasma region of a process chamber and the sidewall, when the plasma lining structure and the plasma confinement structure are disposed in the process chamber, such that the plurality of sections directly faces the plasma region, wherein a pair of adjacent sections are configured to define a gap located therebetween, the gap exposing a corresponding portion of the inner surface of the sidewall to the plasma region.

2. The plasma lining structure of claim 1, wherein each section of the plurality of sections is arc-shaped.

3. The plasma lining structure of claim 1, wherein the plurality of sections are configured to form a ring substantially covering the entirety of the inner surface of the sidewall, and wherein each pair of adjacent sections is joined together at an interlocking interface.

4. The plasma lining structure of claim 1, wherein each section further includes one or more windows configured to expose corresponding portions of the inner surface of the sidewall to the plasma region, the corresponding portions exposed by the one or more windows providing a direct path for plasma to ground via the sidewall.

5. The plasma lining structure of claim 1, wherein the plasma confinement structure is a C-shroud having a top section, a vertical section representing the sidewall and a bottom section; and wherein each of the plurality of sections includes a plurality of segments including, a vertical segment configured to cover the vertical section, a top segment configured to cover an underside surface of the top section, and a bottom segment configured to cover a top surface of the bottom section.

6. The plasma lining structure of claim 5, wherein the bottom segment of each section includes a plurality of liner slots that align with corresponding slots defined in the bottom section of the C-shroud and are configured to provide an unhindered path for plasma to escape from the plasma region.

7. The plasma lining structure of claim 1, wherein the plasma confinement structure is made of at least one of aluminum and silicon, and the plasma lining structure is made of at least one of a dielectric material and quartz.

8. The plasma lining structure of claim 1, wherein the plasma confinement structure is a C-shroud having a top section, a vertical section representing the sidewall and a bottom section; and wherein each of the plurality of sections includes a plurality of segments including, a vertical segment configured to cover the vertical section, and a top segment configured to cover an underside surface of the top section.

9. The plasma lining structure of claim 1, wherein the plasma confinement structure is a C-shroud having a top section, a vertical section representing the sidewall and a bottom section, and wherein each of the plurality of sections includes a plurality of segments including, a vertical segment configured to cover the vertical section, and a bottom segment configured to cover a top surface of the bottom section, the bottom segment including a plurality of liner slots that are aligned with corresponding slots defined in the bottom section.

10. The plasma lining structure of claim 1, wherein the plurality of sections are configured to block a direct path to ground via the sidewall of the plasma confinement structure for plasma generated within the process chamber.

11. The plasma lining structure of claim 1, wherein the plasma confinement structure is an E-shroud having a top section, a vertical section representing the sidewall, a bottom section and one or more annular protrusions extending from the vertical section, wherein the top section and an adjacent first annular protrusion are configured to define a first space located therebetween, the bottom section and an adjacent second annular protrusion are configured to define a second space located therebetween, and a pair of adjacent annular protrusions are configured to define a corresponding third space located therebetween, wherein a first group of one or more of the plurality of sections is disposed in the first space thereby covering a corresponding portion of the inner surface of the sidewall;

wherein a second group of one or more of the plurality of sections is disposed in the second space thereby covering a corresponding portion of the inner surface of the sidewall; and wherein a third group of one or more of the plurality of sections is disposed in the corresponding third space thereby covering a corresponding portion of the inner surface of the sidewall.

12. The plasma lining structure of claim 11, wherein at least one of the first, second and third groups includes at least the pair of adjacent sections with the gap located therebetween, the gap exposing the corresponding portion of the inner surface of the sidewall to the plasma region.

13. A plasma confinement structure for use in a process chamber to confine plasma generated in the process chamber to a plasma region defined between an upper electrode and a lower electrode, comprising:

a sidewall in a vertical orientation and with an annular shape, the sidewall having an inner surface; and a plasma lining structure including a plurality of sections configured to conform to and cover at least one or more portions of the inner surface, wherein the plurality of sections are configured for positioning between the plasma region and the sidewall, when the plasma confinement structure and the plasma lining structure are disposed in the process chamber, such that the plurality of sections directly faces the plasma region, wherein a pair of adjacent sections are configured to define a gap located therebetween, the gap exposing a corresponding portion of the inner surface of the sidewall to the plasma region.

14. The plasma confinement structure of claim 13, wherein the plasma confinement structure is circular, wherein the plurality of sections are configured to form a ring substantially covering the entirety of the inner surface of the sidewall, and wherein each pair of adjacent sections is joined together at an interlocking interface.

15. The plasma confinement structure of claim 13, wherein each section includes one or more windows configured to expose corresponding portions of the inner surface of the sidewall to the plasma region, the corresponding portions exposed by the one or more windows providing a direct path for plasma to ground via the sidewall.

16. A process chamber for use in confining plasma generated within to a plasma region, comprising:

an upper electrode disposed in a top portion of the process chamber and configured to supply process gas from a gas source to the process chamber, the upper electrode is electrically grounded;

a lower electrode disposed in a bottom portion of the process chamber and oriented opposite to the upper electrode to define the plasma region located therebetween, the lower electrode includes a support surface for supporting a wafer and is connected to a plurality of radio frequency (RF) power sources through corresponding match networks;

a plasma confinement structure is disposed between the upper electrode and the lower electrode and is configured to confine the plasma to the plasma region, the plasma confinement structure including a sidewall in a vertical orientation and with an annular shape, the sidewall having an inner surface; and a plasma lining structure including a plurality of sections configured to conform to and cover at least one or more portions of the inner surface, wherein the plurality of sections are configured for positioning between the plasma region and the sidewall, when the plasma confinement structure and the plasma lining structure are disposed in the process chamber, such that the plurality of sections directly faces the plasma region, wherein a pair of adjacent sections are configured to define a gap located therebetween, the gap exposing a corresponding portion of the inner surface of the sidewall to the plasma region.

17. The process chamber of claim 16, wherein the plasma lining structure is made from at least one of a dielectric material and quartz, the plurality of sections are configured to block a direct path to ground via the sidewall, for the plasma generated within the process chamber.

* * * * *